United States Patent [19]

Herbert

[11] Patent Number: 5,659,455

[45] Date of Patent: Aug. 19, 1997

[54] PACKAGING FOR ELECTRONIC CIRCUITS USING A CAPACITOR AS A STRUCTURAL MEMBER

[76] Inventor: Edward Herbert, 1 Dyer Cemetery Rd., Canton, Conn. 06019-2029

[21] Appl. No.: 625,407

[22] Filed: Mar. 27, 1996

Related U.S. Application Data

[63] Continuation-in-part of Ser. No. 412,124, Mar. 28, 1995, abandoned.

[51] Int. Cl.$^6$ ................................................ H01G 4/00
[52] U.S. Cl. ........................... 361/306.1; 361/301.1; 361/520; 361/535; 361/538; 174/35 R; 174/35 TS
[58] Field of Search ........................ 361/271–273, 361/274.1, 274.2, 274.3, 275.1, 275.2, 275.3, 275.4, 301.1–301.4, 302, 303–304, 306.1, 306.2, 306.3, 308.1, 517–522, 534–540; 174/35 TS, 35 R

[56] References Cited

U.S. PATENT DOCUMENTS

| | | |
|---|---|---|
| 3,098,955 | 7/1963 | Davis et al. ............................. 361/312 |
| 3,426,257 | 2/1969 | Youngquist ............................. 361/328 |
| 4,833,276 | 5/1989 | Ito ............................................ 174/35 R |
| 5,057,648 | 10/1991 | Blough et al. ........................ 174/52.4 |
| 5,223,672 | 6/1993 | Pinneo et al. ........................ 174/52.4 |
| 5,433,110 | 7/1995 | Gertz et al. ........................... 73/514.35 |

*Primary Examiner*—Leo P. Picard
*Assistant Examiner*—Phuong T. Vu

[57] ABSTRACT

A package for electronic circuits can be made using a bottom plate, a top plate, and side walls which are stick capacitors. The top and bottom plates can be used as two of the terminations for the electronic circuit to provide a low impedance connection for heavy currents. The contact areas of the stick capacitor are bonded to the top and bottom plates, such as by reflow soldering. The top and bottom plates and the stick capacitor side walls provide a completely enclosed equivalent of a Faraday shield for superior EMI enclosure. Although the top and bottom are isolated electrically at DC by the dielectric layers of the capacitor, they are effectively short circuited at higher AC frequency. The stick capacitors can be drilled through to provide for additional conductors to the electronic circuit. In another embodiment of the invention, a stiffener for a printed circuit board comprises a stick capacitor as a filler for a laminated beam in which the top and bottom stress members are conductors.

4 Claims, 2 Drawing Sheets

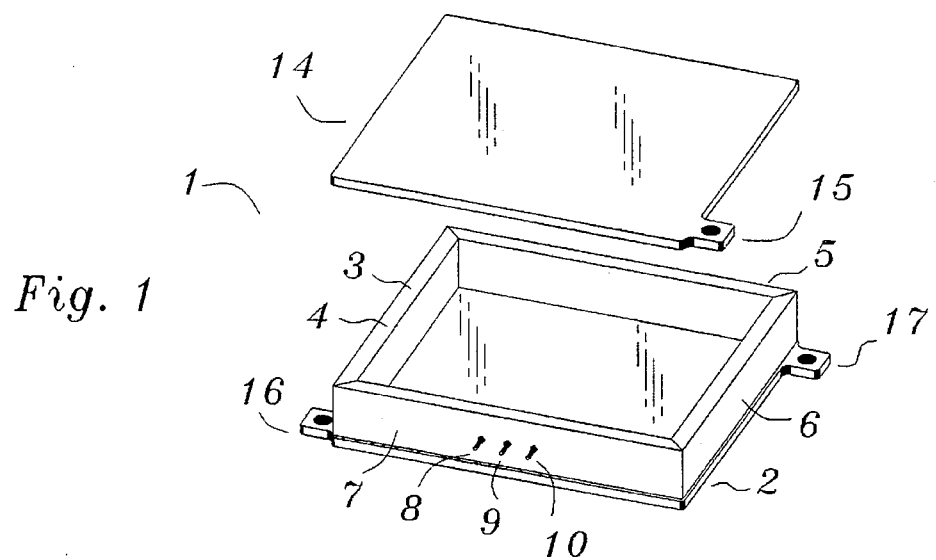
Fig. 1
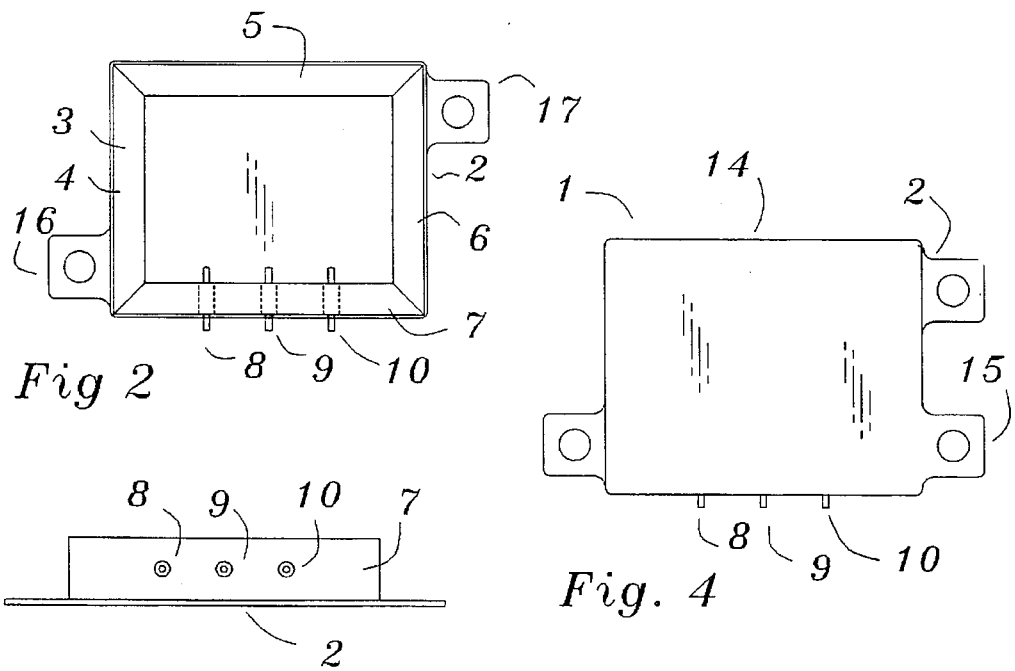
Fig 2
Fig. 3
Fig. 4
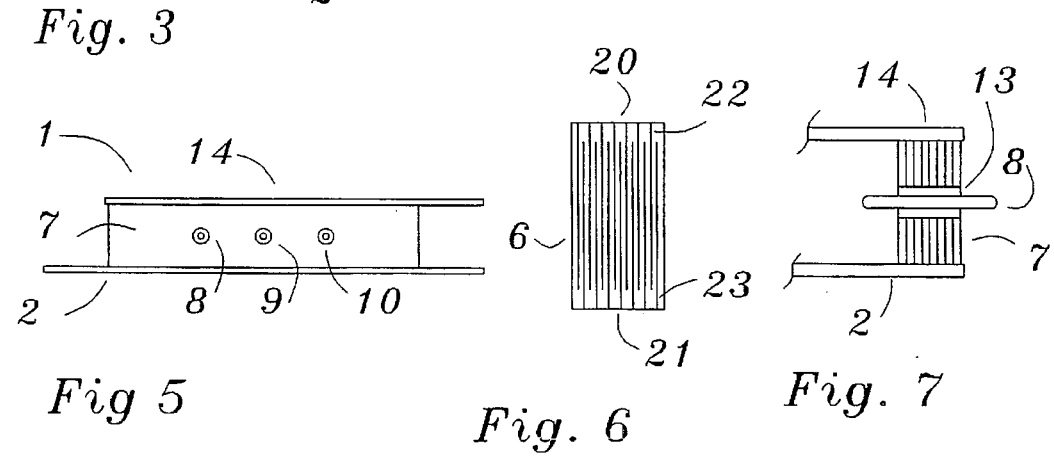
Fig 5
Fig. 6
Fig. 7

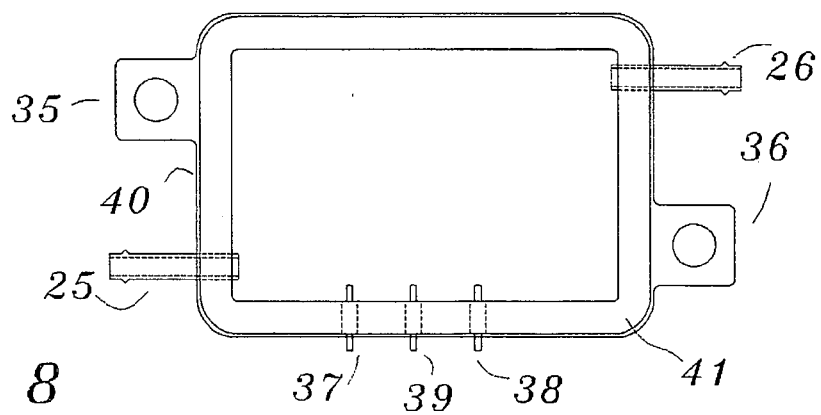
Fig. 8
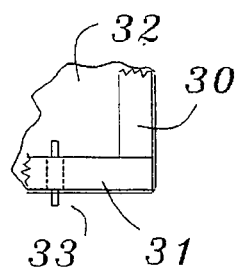
Fig. 9
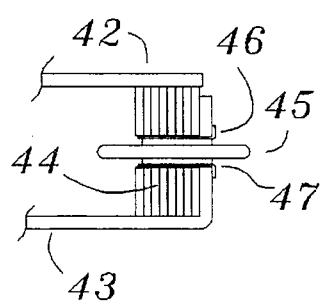
Fig. 10
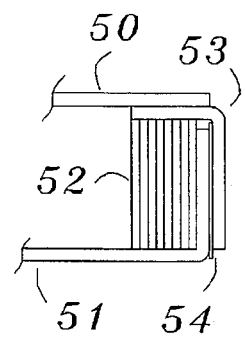
Fig. 11
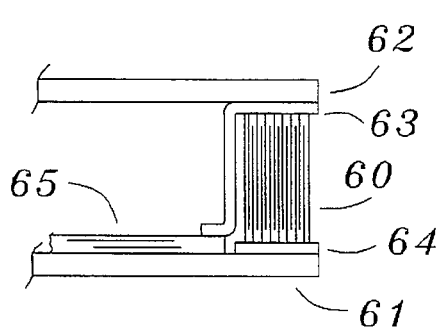
Fig. 12
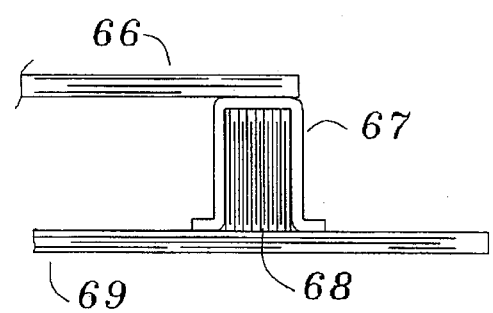
Fig. 13
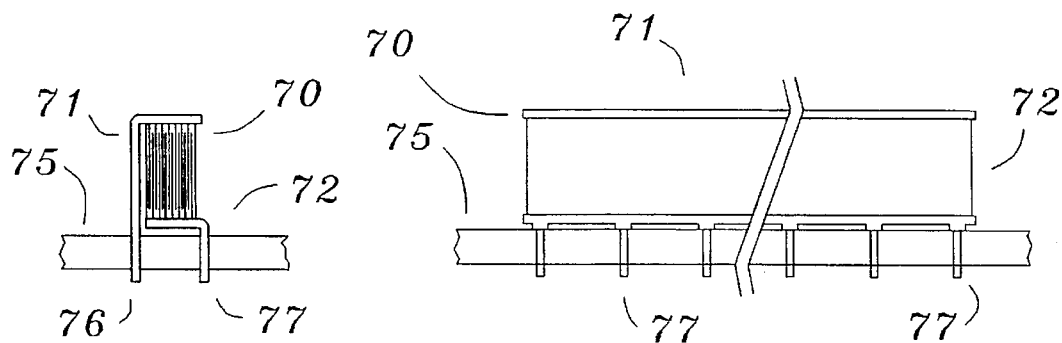
Fig. 14
Fig. 15

PACKAGING FOR ELECTRONIC CIRCUITS USING A CAPACITOR AS A STRUCTURAL MEMBER

This application is a continuation-in-part of Ser. No. 08/412,124, filed Mar. 28, 1995 now abandoned.

BACKGROUND OF THE INVENTION

In electronic packaging, there is often a need for very low impedance terminations, particularly in power circuits with high currents.

In many power circuits, there is also a need for a capacitor which is connected to the low impedance terminations, and it is desirable for it to be connected so as to have the lowest possible impedance, in particular, very low equivalent series inductance (ESL).

Often there is a need to provide an enclosure which contains electro-magnetic interference (EMI).

New multilayer polymer (MLP) capacitors can be produced in stick form having their electrical contact areas on two opposite sides of the stick. These stick capacitors have high structural strength and integrity. One example is the CAPSTICK®, manufactured by I T W Paktron. They are available commercially in a variety of sizes and ratings.

SUMMARY OF THE INVENTION

A package for electronic circuits can be made using a bottom plate, a top plate, and side walls which are stick capacitors. The top and bottom plates can be used as two of the terminations for the electronic circuit. The contact areas of the stick capacitor are bonded to the top and bottom plates, such as by reflow soldering.

The top and bottom plates and the stick capacitor side walls provide a completely enclosed equivalent of a Faraday shield for a superior EMI enclosure. Although the top and bottom are isolated electrically at DC by the dielectric layers of the capacitor, they are effectively short circuited at higher AC frequency.

In another embodiment of the invention, a stiffener for a printed circuit board comprises a stick capacitor as a filler for a laminated beam in which the top and bottom stress members are conductors.

BRIEF DESCRIPTION OF THE FIGURES

FIG. 1 shows a package for an electronic circuit, with the cover not yet installed.

FIGS. 2 and 3 show a top view and a side view of the package for an electronic circuit, with the cover not yet installed.

FIGS. 4 and 5 show a top view and a side view of the package of FIGS. 1, 2 and 3 with the cover in place.

FIG. 6 shows a section through a stick capacitor.

FIG. 7 shows one method of providing additional terminations for the electronic circuit.

FIG. 8 shows that the capacitor can be wound on a rectangular mandrel, thus being continuous around the corners of the package.

FIG. 9 shows an alternative arrangement of stick capacitors having square cut corners with a butt joint.

FIG. 10 shows that the bottom plate can be bent upward, and may provide an attachment for shielded terminations.

FIG. 11 shows an embodiment of the package having improved thermal conduction between the top plate and the bottom plate.

FIG. 12 shows that the stick capacitor may have a top termination within the package to a conductive plane on a circuit board.

FIG. 13 shows that the bottom plate and/or the top plate of the package for an electronic circuit may comprise a printed circuit card, and that the printed circuit card may extend well beyond the package.

FIGS. 14 and 15 show that the stick capacitor may be used with top and bottom stress members as a stiffener for a printed circuit board.

DESCRIPTION OF THE PREFERRED EMBODIMENT

FIGS. 1 through 5 show a package 1 for an electronic circuit comprising a bottom plate 2 and a top plate 14. The side walls of the package 1 comprise a capacitor 3 which may be assembled of four stick capacitors 4, 5, 6 and 7.

The bottom plate 2 may have integral mounting means, and tabs 16 and 17 for screws are shown as an illustration, not a limitation. There are many variations and alternative mounting means which would be well known to one skilled in the art of electronic packaging. In the package 1 as shown, it is contemplated that the bottom plate 2 is a high current termination for the electronic circuit to be contained within the package 1, and that the electrical connection would be through the bottom plate to a mounting surface to which it is attached by any of various means.

This mounting surface may be a heat sink or part of a chassis, and if it is used to carry current, it is "live", in the jargon of the trade. Alternatively, the bottom plate 2 could be provided with termination means such as terminals, lugs, bonded wires or cables, and so forth, so that it may be mounted to a heat sink or chassis with an interposed insulating layer. These various methods of effecting a mechanical and an electrical connection are well known to one skilled in the art, and are not central to the points of novelty of this invention, and thus only a representative example is shown.

The top plate 14 may have an integral connection means for making a connection to the external circuits to which the electronic circuit is to be connected. In the package 1 as shown, it is contemplated that the top plate 14 is a high current termination for the electronic circuit to be contained within the package 1, and that the electrical connection would be made to the external circuits by attaching a conductor to the top plate 14. A tab 15 for receiving a screw or bolt is shown as an illustration but not a limitation. The tab 15 and a bolt may be used to connect the top plate 14 to a bus bar or cable, for example. Alternatives such as terminals, lugs, bonded wires or is cables, and so forth could be used, as would be well known to one skilled in the art.

The capacitor 3 is bonded to the base plate 2, and the top plate 14 is bonded to the capacitor 3 so as to define an enclosure into which an electronic circuit may be packaged. As an illustration and not a limitation, it is contemplated that the capacitor 3 may be soldered to the base plate 2, and that the capacitor 3 and the base plate 2 may then comprise a sub-assembly into which the rest of the circuit components may be installed. Thereafter, the top plate 14 may be soldered onto the capacitor 3.

The top and bottom plates 2 and 14 may be heavy pieces of copper or other metal and would thus be capable of carrying high currents with minimal impedance. In the construction contemplated, the connection to the capacitor 3 is optimum with respect to minimizing series inductance. Obviously to make maximum utility of this invention, the electronic circuit must have very good connection to the bottom and top plates 2 and 14. Methods of making such connections would be well known to one skilled in the art. As an illustration and not a limitation, the electronic circuit may mount on the base plate 2 and parts of the electronic circuit may make direct electrical connection thereto. A number of methods could be used to make connection to the top plate 14. Large conductors of the same height as the capacitor 3 can project upward, and they can be reflow soldered to the top plate 14 when it is soldered to the capacitor 3. A large wide foil conductor could be attached to the top plate 14, and it could fold into the enclosure when the top plate 14 was installed. (Other ideas are presented below, as illustrations, not limitations). One skilled in the art of electronic packaging would understand how to effect suitable connections to the various parts of the electronic circuit and the package 1 for the electronic circuit as necessary for proper functioning thereof.

"Bond", "Bonded", and "Bonding" are used in the specification and the claims as a noun, adjective, verb or gerund as appropriate to define the state of, or the effecting of, a mechanical and/or an electrical connection between the parts. Solder is contemplated for the preferred embodiment, but other means such as conductive adhesives, or holding the parts together by mechanical means such as clamping, bolting, screwing or entrapment are included in the definitions as used in the specification and the claims. For the purpose of this specification and the claims, a first part may be "bonded" to a second part through one or more intermediate parts interposed between the first and the second parts if there is mechanical and/or electrical connection between the parts, as, for an example but not a limitation, in the arrangement shown in FIG. 12.

In the jargon of the art of making and assembling electrical and electronic devices, parts are said to be "connected" even though there is no direct contact between the parts so long as there is a continuity of conductors between the parts.

Obviously there is great flexibility in using this invention, in the choice and arrangement of the materials and parts used, and in the order of construction.

The electronic circuit will very likely require additional electrical connections, and terminals 8, 9, and 10 are shown as an illustration, not a limitation. These terminals may carry relatively lower current. The terminals 8, 9 and 10 may be passed through the capacitor 3 through drilled holes. This is discussed in more detail below.

Alternatively, pins, lugs, connectors and the like may be installed in or through either or both of the bottom plate 2 and the top plate 14 by methods well known to one skilled in the art of electronic packaging.

FIG. 6 shows a diagrammatic section through the a stick capacitor, which may be the stick capacitor 6 of FIG. 1. In actuality, there are a very large number of conducting and dielectric layers, and they are very thin, so they cannot possibly be shown in actual scale. FIG. 6 shows a few of the layers in exaggerated scale showing that one set of electrodes 22 extends upward and connects to a top metalization layer 20. The other set of electrodes 23 extends downward and connects to a bottom metalization layer 21. As is well known to one skilled in the art of capacitors, these electrodes 22 and 23 comprise a large number of layers alternately attached to the metalizaton layers 20 and 21 and separated by dielectric layers. Capacitors are made of a variety of materials and in a variety of designs, and many different styles of capacitor could be used in this invention.

As an illustration and not a limitation, the multilayer polymer (MLP) capacitor may use ultra-thin polyethylene-terephthalate polymer film as the dielectric. The electrodes may comprise a metalization deposited on the film. In manufacturing, the metalized layers of film may be stacked and subjected to pressure and heat to form a rigid structure. These capacitors are routinely made in long sticks, and the capacitor sticks are then metalized top and bottom. They then may be cut into pieces of the desired length to make capacitor components of various sizes and values. Thus they similarly can be cut to length to make the side walls of packages for electronic circuits. A number of widths, heights, and dielectric voltages ratings are available commercially so there is a good choice of dimensions and ratings.

It is a property of metalized film capacitors that short circuits caused by defects in the film or whatever can be "cleared" by applying electrical energy. This removes the metalization layer in the vicinity of the fault without damaging the dielectric film, leaving an insulating margin. Any short circuits between the electrodes as a consequence of cutting the stick capacitors to length and other machining operations may be cleared similarly, and once cleared, the capacitor has good integrity and reliability.

It is also possible to drill holes through the stick capacitors, and any resulting short circuits may be cleared similarly. Thus it is possible to provide conduits through the stick capacitor side walls for terminals, such as terminals 8, 9 and 10. This is shown in more detail in FIG. 7. The stick capacitor 7 has been drilled through with a hole somewhat larger than the terminal 8. An insulation means 13 surrounds the terminal 8 within the hole through the stick capacitor 7. This insulation means could be a plastic or other insert, or it could be an insulating compound which could be used to bond the terminal 8 in place.

The terminals 8, 9 and 10 are shown for illustration, not as a limitation. The important point is that the stick capacitors can be drilled through without degrading their integrity or reliability to provide a means for additional conductors to connect with electronic circuit to be contained within the package 1. The quantity and the nature of the terminals is not central to the point of novelty. One hole could be used for multiple small wires in a cable. It is obvious that the through holes could be used for other purposes as well, such as access for adjustments, for mechanical members, for fluid conduits, and so forth.

FIG. 8 shows that connections 25 and 26 for a cooling fluid could be bonded into the capacitor 41. If the connections 25 and 26 are made of conductive material, they could also be electrical conductors.

Although four side walls are shown as being stick capacitors 4, 5, 6 and 7 in FIGS. 1 through 5, it is obvious that other arrangements could be used. For instance one or two side walls, or portions thereof, could be stick capacitors with the remainder of the side walls being fabricated of other suitable material. There could be non-rectangular enclosures. Also, internal partitions could be made of stick capacitors to provide separated internal compartments.

It is also possible to make a package for an electronic circuit using one capacitor element made in the shape of the periphery of the package. FIG. 8 shows a capacitor 41 mounted on a base plate 40. The capacitor 41 may be wound on a rectangular mandrel, the dimensions of the mandrel defining the interior dimensions of the package. Film capacitors are routinely wound on mandrels of different shapes and sizes and this method of manufacture can be adapted to this invention. The capacitor construction could be metalized foil or extended foil. Once wound, the edges may be metalized, and once that is done, the capacitor would have useful mechanical integrity. The capacitor could also be impregnated with a bonding agent or it could be subjected to heat and pressure normal to the side walls. It could be reinforced with one or more outer wrap of heavy material. This would be obvious to one skilled in the art of making capacitors.

For the purpose of this specification and the claims, a "stick capacitor" is any capacitor or part thereof which is suitable for use as one or more side walls of an enclosure. Often the stick capacitor would be a straight, rod like piece of rectangular section, but it could also be a curved piece, a serpentine piece or piece that closes upon itself to be the entire perimeter of an enclosed space.

As in FIG. 7, terminals 37, 38 and 39 can be mounted in holes drilled through the capacitor 41. If the capacitor 41 is not of a bonded construction, then firm clamping pressure should be applied as the capacitor is being drilled so that the layers therein are not disarranged. After the holes are drilled, the adhesive that retains the connector pins will also bond the layers in the vicinity of the holes and reinforce the structure of the capacitor.

Whereas FIG. 1 showed stick capacitors 4, 5, 6, and 7 having beveled joints at the corners, FIG. 8 shows that the stick capacitors may be cut square and joined as a butt joint. Stick capacitors 30 and 31 are joined at the corner and are mounted on a base plate 32. A terminal 33 passes through stick capacitor 33. The beveled corners of FIGS. 1 through 5 avoids having exposed end cuts, but there are many ways in which a package may be assembled. These examples are as illustrations, not limitations. It would be obvious to one skilled in the art of electronic packaging that any of a number of commonly used materials and techniques could be used in combination with the teachings of this invention to adapt the package to various applications and/or to protect it in different environments.

FIG. 10 shows that a base plate 43 may be bent upward along the side of a capacitor 44. This may be done for additional mechanical strength and protection for the capacitor 44, but it may also provide a mounting surface for terminations requiring a ground plane connection. As an illustration and not a limitation, a terminal 45 is bonded into an eyelet 46 with an insulator 47 between the terminal 45 and the eyelet 46. The eyelet 46 can then be soldered to the upward extension of the base plate 43. Such construction is common with filter pin connectors or coaxial connectors. Alternative constructions are common, such as threaded bushings and nuts and so forth.

FIG. 11 shows another embodiment of the invention. A capacitor 52 is mounted to a base plate 51 which is bent to extend upward along the face of the capacitor 52. A top mounting boss 53 is bonded to the top of the capacitor 52. The top mounting boss 53 may be extended and bent down along the face of the capacitor 52 over the upward extension of the base plate 51. To prevent a short circuit, an intervening insulation layer 54 or other insulating means may be used. A cover plate 50 may be bonded to the top mounting boss 53 after the electronic circuit is in place, effecting a connection and a bond to the capacitor 52 and to enclose the electronic circuit.

Often electronic circuits will be mounted on the bottom of the package, often on a substrate or circuit card. The package may then be mounted to a heat sink to effect withdrawal of heat from the circuit through the bottom plate 51. To improve packaging space utilization, it may be desirable to mount circuits to the top plate 50 as well. The construction of FIG. 11 provides an improved heat flow path from the top plate 50 to the bottom plate 51, particularly if the insulating layer 54 is thin and of material having a good thermal conductivity.

FIG. 12 shows another embodiment of the invention, having adaptive features which would be useful in some applications. A stick capacitor 60 forms a side of a package similar to the package of FIGS. 1 through 5. A base plate 61 and a top plate 62 comprise the bottom and top of the package, respectively. Interposed between the stick capacitor 60 and the bottom plate 61 is a transition piece 64.

In the construction of some electronic circuits, such as hybrid circuits, heat in excess of that which the capacitor 60 could tolerate may be used, such as to braze semiconductor chips to the base plate. In other applications, it might be desired to assemble the circuit on base plate without the side walls being present. This can certainly be done, and the stick capacitor side wall could be bonded to the base plate later, in a subsequent operation. It may be desirable to have a transition piece 64 bonded to the capacitor stick assembly, to reinforce it, to provide a more compatible surface, or to provide material that can be machined or ground to precise dimensions. If the capacitor enclosure is to be mounted on a printed wiring board, the transition piece 64 could provide improved conductivity at the interface. It is even possible that the bottom plate 61 would not be conductive or would be a poor conductor, and they transition piece 64 would be the conductor.

FIG. 12 also shows a top conductor piece 63 interposed between the stick capacitor 60 and the top plate 62. In many electronic circuits, all of the interconnections will be near the bottom of the package. The top conductor piece 63 provides a way of interconnecting the top of the stick capacitor 60 with the rest of the circuit. The top conductor piece 63 obviously could be a simple stamping, and it could be designed to contact designated areas of the circuit and clear others. A further advantage of this construction is that the circuit would be complete and could be tested prior to installing the cover. The cover could, if desired, be a non conductor or a poor conductor. These are given as examples for illustration and not as limitations. Once the teachings of this invention are understood, those skilled in the art will be able to adapt it in a number of imaginative ways.

In the example of FIG. 12, a circuit card 65 is mounted on the base plate 61. The top conductor piece 63 provides an electrical connection between the top of the capacitor 60 and the top surface of the circuit card 65. As an illustration, not a limitation, the top surface of the circuit card 65 may be a conductive plane (having openings therein as necessary to accommodate components and connections thereto, as is well understood in the art). In this example, the space within the package would be within a Faraday shield comprising the top plate 62, the top conducting piece 63, and the conductive plane on the top of the circuit card 65. Other conductors and interconnections could be within internal layers of the circuit card 65 and the bottom layer of the circuit card 65 could be a second conductive plane electrically connected to the base plate 61, the transition piece 64 and the bottom metalization of the capacitor 60.

FIG. 13 shows that one or both of the bottom plate and the top plate could be printed circuit boards. A bottom printed circuit board 69 and a top printed circuit board 66 can have printed wiring conductors forming ground or potential planes and can have circuit conductors on or within one or both of the printed circuit boards 66 and 69. In the example, as an illustration and not a limitation, the bottom printed circuit board 69 might comprise a multilayer circuit board having a conductive plane on the top, a conductive plane on the bottom and internal connections in layers therein, as is well known to one familiar with the art.

It is well known to put conductive "vias" between layers in a circuit board to effect conduction between two or more of the layers therein. Thus the bottom metalization of the capacitor 68 can be bonded to the bottom circuit card 69, and using vias, it could thence be connected to a bottom conductive plane on the circuit card. The top metalization of the capacitor 68 can be bonded to a transition piece 67 which is then bonded to a top conductive plane of the bottom circuit board 69 both inside and outside of the enclosure. The top printed circuit board 66 can then be bonded to the transition piece 67 to become the cover of the package.

The transition piece 67 can, alternatively, connect to the bottom circuit board 69 on only one side of the capacitor 68, either inside or outside of the package in stead of on both sides as shown. In this case, a conductor within the bottom circuit board 69 can provide an electrical connection as required.

Alternatively, a stack comprising a metal bottom plate, an enclosure of stick capacitors, a circuit board, another enclosure of stick capacitors and a metal top plate would provide a very versatile packaging and interconnection scheme. Any number of conductors could enter and exit the package on and within the circuit board which could extend beyond the enclosures in one or more directions.

FIGS. 14 and 15 shows a stick capacitor 70 used as a stiffener and/or bus bar for a printed circuit board 75 as well as a capacitor. It should be understood that FIG. 14 is a sectional view, and the stiffener extends for some length normal to the page. A top conductor 71 is bonded to the top of the stick capacitor 70 and extends down the side of the stick capacitor 70. A bottom conductor 72 is bonded to the bottom of the stick capacitor 70. Extending from the top conductor 71 and the bottom conductor 72 are a plurality of tabs for installation through holes in the circuit board 75. FIG. 14 is a sectional view, and FIG. 15 is a side view. Mounting tabs 76 and 77 are provided to mount the stiffener to the circuit board 75. Obviously other mounting means such as surface mount pads could be provided as an alternative.

It is known to use stiffeners on circuit boards, and it is known to use such stiffeners as bus bars for conducting current with low impedance. It is also known to use bus bars employing capacitors. This invention teaches that the stick capacitor 70 has sufficient structural strength to contribute significantly to the rigidity of a stiffener for a circuit board. As shown, the top conductor 71 and the bottom conductor 72 are tension and compression members on the top and bottom of a laminated beam, respectively, with the stick capacitor 70 comprising the filler section of the laminated beam. Because the top and bottom conductors 71 and 72 have sufficient cross section to carry significant current, and because the stick capacitor 70 has a large capacitance, the whole provides a superior bus bar and stiffener for a printed circuit card.

I claim:

1. A package for an electronic circuit comprising
a base plate, the base plate defining the bottom of the package,
side walls,
the side walls defining the periphery of the package,
the side walls further defining at least a space for enclosing at least the electronic circuit,
the side walls further having a top surface and a bottom surface,
the bottom surface of the side walls being bonded to the base plate,
at least a portion of the side walls comprising a stick capacitor,
the stick capacitor having a first electrode and a second electrode
the first electrode and the second electrode being separated by a dielectric,
the first electrode being terminated at a metallized surface at the bottom of the stick capacitor in alignment with the bottom of the side walls
the metallized surface at the bottom of the stick capacitor being bonded to the base plate
the second electrode being terminated at a metallized surface at the top of the stick capacitor in alignment with the top of the side walls, and
a top plate, the top plate defining the top of the package,
the top plate further being bonded to the top surface of the side walls and the metallized surface at the top of the stick capacitor.

2. The package for an electronic circuit of claim 1
wherein at least one of the bottom plate and the top plate is a good conductor of electricity, and
wherein at least one of the bottom plate and the top plate comprises an electrical termination for the electronic circuit.

3. The package for an electronic circuit of claim 1
wherein the stick capacitor has at least one hole drilled through from the outside of the package to the inside of the package
for at least one of an electrical conductor, a mechanism, a fluid conduit, and access for adjustment.

4. A stiffener for a printed circuit board comprising
a bottom plate,
the bottom plate having a plurality of attachment means for attaching the stiffener to the printed circuit board,
a stick capacitor,
the stick capacitor having a first electrode and a second electrode
the first electrode and the second electrode being separated by a dielectric,
the first electrode being terminated at a metallized surface at the bottom of the stick capacitor
the metallized surface at the bottom of the stick capacitor being bonded to the base plate
the second electrode being terminated at a metallized surface the top of the stick capacitor, and
a top plate,
the top plate being bonded to the metallized surface at the top of the stick capacitor
the top plate further having downward extension to the printed circuit board
the downward extension of the top plate further having a plurality of attachment means for attaching the downward extension of the top plate to the printed circuit board.

* * * * *